(12) United States Patent
Novellini

(10) Patent No.: US 11,212,072 B1
(45) Date of Patent: Dec. 28, 2021

(54) CIRCUIT FOR AND METHOD OF PROCESSING A DATA STREAM

(71) Applicant: Xilinx, Inc., San Jose, CA (US)

(72) Inventor: Paolo Novellini, Gorgonzola (IT)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/130,991

(22) Filed: Dec. 22, 2020

(51) Int. Cl.
*H04L 7/033* (2006.01)
*H04L 7/00* (2006.01)

(52) U.S. Cl.
CPC .......... *H04L 7/033* (2013.01); *H04L 7/0041* (2013.01)

(58) Field of Classification Search
CPC ......... H04L 7/02; H04L 7/033; H04L 7/0041; H04L 7/0079; H03L 7/07
See application file for complete search history.

(56) References Cited

U.S. PATENT DOCUMENTS

| | | | |
|---|---|---|---|
| 6,147,713 A | 11/2000 | Robbins et al. | |
| 6,275,553 B1 | 8/2001 | Esaki | |
| 6,456,164 B1 | 9/2002 | Fan | |
| 7,039,149 B2 | 5/2006 | Tagami | |
| 7,483,506 B2 * | 1/2009 | Yajima | H03L 7/087 |
| | | | 375/365 |
| 7,519,750 B2 | 4/2009 | Scouten | |
| 7,576,576 B2 | 8/2009 | Drexler et al. | |
| 8,416,902 B2 * | 4/2013 | Kyles | H04L 7/0338 |
| | | | 375/355 |
| 8,666,010 B1 | 3/2014 | Novellini | |
| 8,681,919 B1 | 3/2014 | Novellini | |
| 9,992,049 B1 | 6/2018 | Novellini | |
| 10,122,527 B1 * | 11/2018 | Fischer | H04L 7/033 |
| 2006/0133559 A1 | 6/2006 | Glass | |
| 2008/0124092 A1 | 5/2008 | Dvir et al. | |
| 2009/0092213 A1 | 4/2009 | Eker et al. | |
| 2010/0067633 A1 | 3/2010 | Den Besten | |
| 2010/0091921 A1 | 4/2010 | Den Besten et al. | |
| 2010/0172457 A1 | 7/2010 | Den Besten | |
| 2010/0189433 A1 | 7/2010 | Trojer | |
| 2010/0221000 A1 | 9/2010 | Yang | |
| 2010/0232558 A1 | 9/2010 | Terada et al. | |
| 2011/0001530 A1 | 1/2011 | Nishi et al. | |

(Continued)

FOREIGN PATENT DOCUMENTS

EP   1 061 691 A2 * 12/2000 ........... H04L 7/0333

OTHER PUBLICATIONS

Xilinx XAPP 1277 "Burst Clock Data Recovery for 1.25G/2.5G PON Applications in Ultrascale Devices" P. Novelli, a Di Fresco and M. Chirico, Published Nov. 14, 2016.

(Continued)

*Primary Examiner* — Betsy Deppe
(74) *Attorney, Agent, or Firm* — Patterson + Sheridan, LLP

(57) ABSTRACT

A circuit for processing a data stream is described. The circuit comprises a burst phase detector configured to receive a data input signal; a clocking circuit coupled to the burst phase detector, wherein the clocking circuit is configured to receive a delayed data input signal and to receive a data stream phase signal and a data stream detect signal; and a programmable clock generator configured to receive a plurality of clock signals; wherein a selected clock signal of the plurality of clock signals is generated by the programmable clock generator and provided to the burst phase detector and the clocking circuit.

20 Claims, 9 Drawing Sheets

(56) References Cited

U.S. PATENT DOCUMENTS

2011/0001531 A1   1/2011  Nishi et al.
2011/0135306 A1   6/2011  Kim et al.
2014/0105614 A1   4/2014  Nishi et al.

OTHER PUBLICATIONS

XAPP 1252 "Burst-Mode Clock Data Recovery With GTH and GTY Transceivers" E. Lee and C Leung, Published Apr. 12, 2019.
"A Multi-Rate Burst-Mode CDR Using a GVCO With Symmetric Loops for Instataneous Phase Locking in 65-NM CMOS" K, Kishine, H. Inaba, H Inoue, M. Nakumara, A. Tsuchiya, H. Katsurai, and H. Onodera, IEEE Transactions On Circuits and Systems 1: vol. 62, Issue 5, May 2015.
Maxim, 622MBPS Burst-Mode Clock Phase Aligner for GPON OLT Applications, MAX3634, Rev O, Sep. 2005, Maxim, Sunnyvale, California, USA.
Xilinx, Inc. "Fractional Burst Clock Data Recovery For XG-PON Application", Application Note 7 Series FPGA's XAPP 1083 (V1.0.2), Jan. 17, 2014, pp. 1-19, San Jose, USA.
Wikipedia,"Euclidean Algorithm", Dec. 18, 2020, 33 pages, https://en.wikipedia.org/w/index.php?title=Euclidean_algorithm&oldid=995020773.

* cited by examiner

CIRCUIT FOR AND METHOD OF PROCESSING A DATA STREAM

FIELD OF THE APPLICATION

An embodiment described herein relates generally to a circuit and method for processing a data stream, and in particular to a phase detector for processing data streams of a bursty data system.

BACKGROUND

Bursty data systems involve several transmitters communicating with a single receiver over a shared medium using a time-sharing technique. In a bursty data system, different transmitters are provided different time slots during which they can communicate exclusively with the receiver. Transmitters in a conventional bursty data system transmit data at the same frequency, but different phases. For a receiver to accurately process the data being transmitted by a transmitter, the phase of the data stream must be quickly detected in order for the receiver to accurately sample data from the data stream. Acquiring the phase of the data stream allows the receiver to sample data from the data stream at points where the signal representing the data stream is more reliable because they may be less affected by local noise. The time it takes for the receiver to detect the phase of the data stream and to begin accurately sampling the data using the detected phase relative to the start of data sampling is referred to as locking time. A goal of phase detection in a bursty data system is to minimize the locking time.

However, as technology improves and faster burst clock and data recovery units (BCDRs) become available, telecom operators can only upgrade the BCDR to a higher line rate if all clients upgrade their optical network units (ONUs) to the new technology at the same time.

Accordingly, there is a need to enable a BCDR to operate using a plurality of different clock signals.

SUMMARY

A circuit for processing a data stream is described. The circuit may comprise a burst phase detector configured to receive a data input signal; a clocking circuit coupled to the burst phase detector, wherein the clocking circuit is configured to receive a delayed data input signal and to receive a data stream phase signal and a data stream detect signal; and a programmable clock generator configured to receive a plurality of clock signals; wherein a selected clock signal of the plurality of clock signals is generated by the programmable clock generator and provided to the burst phase detector and the clocking circuit.

A method of processing a data stream is also described. The method may comprise configuring a burst phase detector to receive a data input signal; coupling a clocking circuit to the burst phase detector, wherein the clocking circuit is configured to receive a delayed data input signal and to receive a data stream phase signal and a data stream detect signal; and configuring a programmable clock generator to receive a plurality of clock signals; wherein a selected clock signal of the plurality of clock signals is generated by the programmable clock generator and provided to the burst phase detector and the clocking circuit.

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments is rendered, and illustrated in the accompanying drawings. These drawings depict only exemplary embodiments and are not therefore to be considered limiting of its scope.

DETAILED DESCRIPTION

Figure 1:
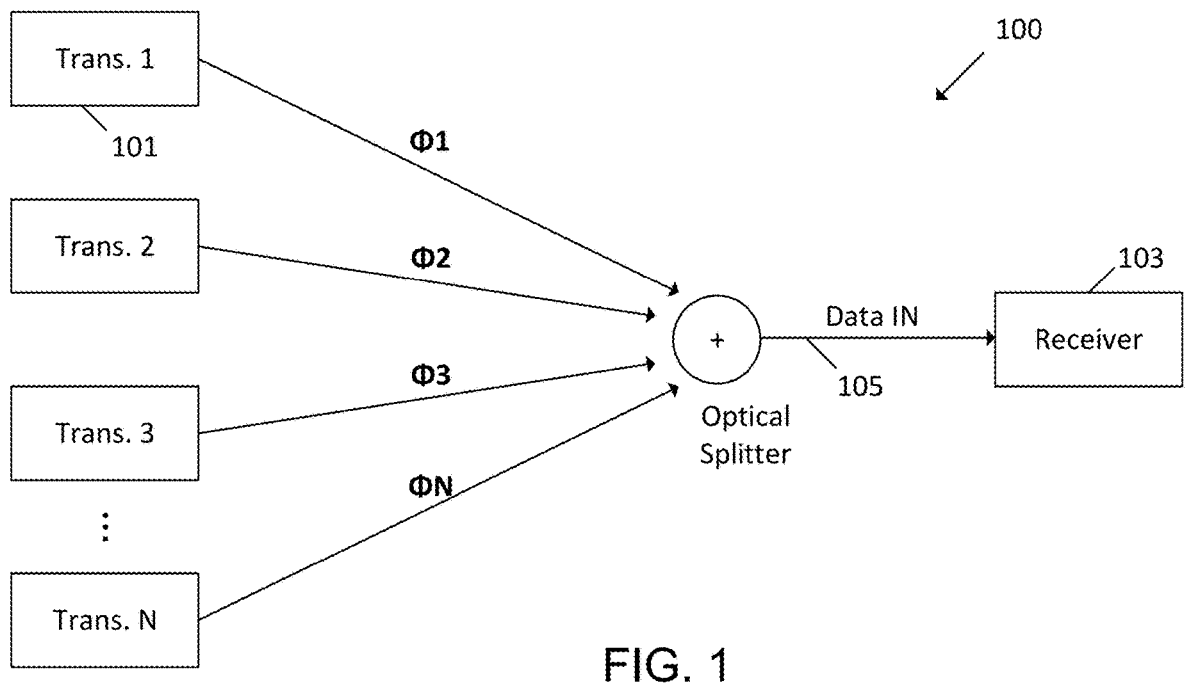
FIG. 1 illustrates an example of a bursty data system.

A Passive Optical Networking (PON) is a type of bursty data system that is commonly used in last-mile technology to deliver internet data to user premises. There are advantages of PON compared to other technologies, such as cable using a DOCSIS standard. For example, outdoor cabinets for PON are generally passive, thus less prone to faults. Further, the fiber does not create bandwidth limitations. Rather, a bandwidth limitation is only from the electronics, which does not reside in outside cabinets. This represents only the upstream data transmission, from clients to the Central Office (CO). Each client transmits to the CO during its own time slot; and only one client is active at a given time. The slot availability is managed by the CO runtime, which gives telecom operators the ability to allocate the upstream bandwidth depending on client or even runtime.

Over time, as technology improves and faster BCDRs become available, an operator must ask all clients to upgrade their ONUs to the new technology in order to upgrade a BCDR. According to one implementation, clients can upgrade their ONU as soon as they want to benefit from the increased upstream line rate. However, if they do not need to transmit data at a different rate, they can simply use their original ONU. A multi rate BCDR is required to allow this network to operate correctly. The circuits and methods below describe a new BCDR architecture, which can receive packets with different line rate, i.e. the line rate may be changing packet to packet from the upstream transmitters.

The architecture of the circuits and methods set forth below can support several line rates in the same network (including the case with a different line rate per client), with no requirement to have the line rates related by integer multiples. This is significant when compared to other implementations, where clock gating is simply used to change the line rate by an integer factor. The Ethernet Passive Optical Network (EPON) case (i.e. 1.25 G and 10.31 5 Gbit/s) is the typical example where rates do not have an integer ratio. Further, line rates will likely have non-integer rates, due to the presence of forward error correction (FEC).

The circuits and methods set forth below can be extended to all fields required to have a receiver that works in bursts, where each burst can have its own phase and frequency. It is possible to extend further the solution introducing a modified NCO structure. That is, in addition to a receiver that supports different line rates, the circuits and methods could support fractional rates that have an integer CENTER_FREQUENCY. As will be described in some implementations, all fractional rates can be implemented, independently on the CENTER_FREQUENCY being fractional or integer. In other implementations, the CENTER-FREQUENCY signal can be latched by a PREAMBLE-DETECT signal before being loaded into a second controlled oscillator.

Accordingly, the circuit and methods set forth below include many novel circuits, including a rate to be changed from packet to packet and supporting rates that are not limited to integer multiples of each other. The circuits may be fully synchronous and use one single system clock, independently of the number of rates it supports. Therefore, it is very suited to be implemented in available digital logic, Field Programmable Gate Arrays (FPGAs) or Application Specific Integrated Circuits (ASICs) for example.

Various embodiments are described hereinafter with reference to the figures. It should be noted that the figures are not necessarily drawn to scale, and that the elements of similar structures or functions are represented by like reference numerals throughout the figures. It should be noted that the figures are only intended to facilitate the description of the embodiments. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiment even if not so illustrated, or not so explicitly described. Also, reference throughout this specification to "some embodiments" or "other embodiments" means that a particular feature, structure, material, or characteristic described in connection with the embodiments is included in at least one embodiment. Thus, the appearances of the phrase "some embodiments" or "other embodiments" in various places throughout this specification are not necessarily referring to the same embodiment or embodiments.

FIG. 1 is a block diagram illustrating an example bursty data system 100. Bursty data systems involve several transmitters 101 communicating with a single receiver 103 over a shared medium 105 using a time-sharing technique. In a bursty data system, different transmitters 101 are provided different time slots during which they can communicate exclusively with the receiver 103, which may include a BCDR for example. The transmitters 101 in the bursty data system may transmit data at the different frequency and different phases.

For a receiver 103 to accurately process the data stream being transmitted by a transmitter 101, the phase of the data stream must be quickly detected in order for the receiver 103 to accurately sample data from the data stream. Acquiring the phase of the data stream allows the receiver 103 to sample data from the data stream at points where the signals representing the data stream are more reliable (e.g., less affected by local noise). The time it takes for the receiver 103 to detect the phase of the data stream and to begin accurately sampling the data using the detected phase relative to the start of data sampling is referred to as locking time. A goal of phase detection in a bursty data system is to minimize the locking time.

For data systems that are non-bursty in nature (e.g., one to one correspondence between a transmitter and a receiver), a phase-locked-loop (PLL) may be used at the receiver to perform phase detection on incoming data. The PLL includes a phase detector that compares the incoming data stream to phase information output by a controlled oscillator to generate an error phase of the data relative to the phase information output by the controlled oscillator. The error phase is fed back to the controlled oscillator, which updates its phase information to account for the error, and this process continues until the phase information output by the voltage-controlled oscillator is in sync with the data stream. While reference is generally made to a controlled oscillator, it should be understood that the controlled oscillator could be a voltage-controlled oscillator or a numerically-controlled oscillator, or an oscillator controlled by some other quantity or value.

One technique for utilizing a PLL for a bursty data system involves appending a preamble to the beginning of a data stream being transmitted from a transmitter to the receiver. The preamble may be a fixed length of bits that are used by the receiver to perform phase detection prior to sampling the data stream. Although the PLL will eventually detect the phase of the data stream using the preamble, it does so very slowly, and as such a long preamble length is required to ensure that the phase of the data stream is accurately detected before sampling of the data stream occurs. This technique is undesirable for use within a bursty data system because it requires a long preamble length which leads to an inefficient usage of bandwidth and a long locking time. Moreover, this technique fails to take into account that each transmitter is only allocated a fixed time segment within which its transmitted data stream must be sampled, and a long preamble will lead to too much of the time segment being utilized for phase detection.

Another technique involves utilizing dedicated custom circuitry in combination with a PLL for performing phase detection. A data stream is initially transmitted from a transmitter to the receiver with a preamble that includes a fixed pattern appended to the beginning of the data stream. Dedicated custom circuitry at the receiver is used to perform phase detection on the preamble and steer a voltage-controlled oscillator of the PLL in order to accurately sample the data stream. The size of the preamble is determined by the speed of the dedicated custom circuitry. By increasing the speed of the dedicated custom circuitry, the time it takes to detect the phase from the preamble can be decreased. Even though the locking time is reduced with this technique, it requires the use of dedicated custom circuitry operating at a very fast speed which can become quite costly. Moreover, even though the preamble length can be reduced, a positive locking time may still be required in order to accurately perform sampling of the data stream.

Another technique involves using a zero preamble length to perform phase detection on a data stream, but requires that the transmitters communicate with the receiver in a predictable cyclical manner. The circuits and methods set forth below enable a rate to be changed from packet to packet and support rates that are not limited to integer multiples of each other. The circuits may be fully synchronous and use one single system clock, independently of the number of rates it supports.

Figure 2:
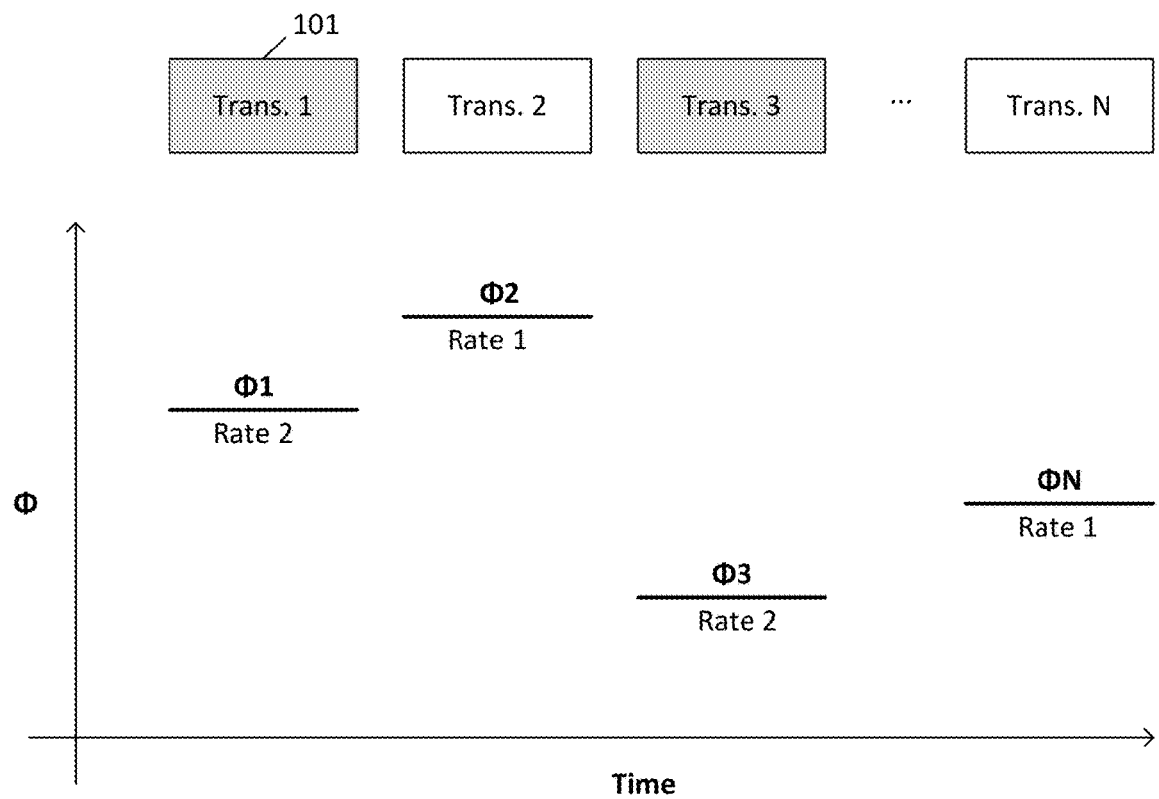
FIG. 2 illustrates an example phase profile for different clients of a bursty data system.

FIG. 2 illustrates an example phase profile for different transmitters 101 of a bursty data system. As shown in FIG. 2, transmitter 1 and transmitter 3 transmit signals during their designated time slots at rate 2, while transmitter 2 and transmitter N transmit their data at rate 1. According to the example of FIG. 2, data transmitted by the transmitters 1-N are transmitted at different phases φ1, φ2, φ3, φN as shown. FIG. 2 represents only the upstream data transmission, from clients to the receiver of the CO. Each client transmits to the CO during its own time slot, and only one client is active at a given time. The slot availability may be managed by the CO runtime, which gives telecom operators the ability to allocate the upstream bandwidth depending on client, or even runtime. The client orchestration is done through the downstream direction, as shown in FIG. 1.

As illustrated in FIG. 2, each transmitter 101 communicates exclusively with the receiver for a given period of time during which data is transmitted at a given phase. The example of FIG. 2 represents a case of a network where only two clients (Transmitter 1 and transmitter N) have upgraded their ONU. On the physical layer, the BCDR of the receiver is significant because it is required to lock quickly to incoming data organized in bursts, as in each burst the data phase can change its phase arbitrarily, where each client may transmit with its own phase.

Figure 3:
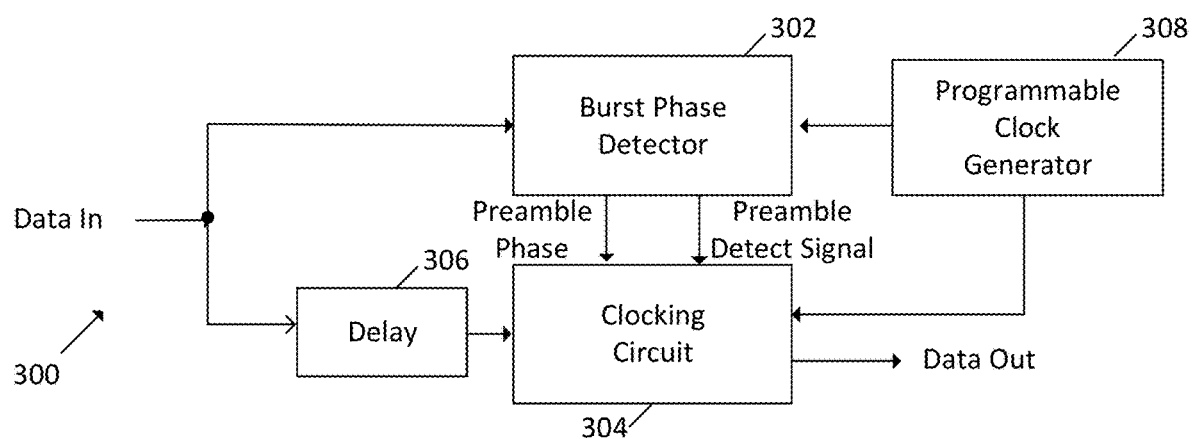
FIG. 3 illustrates an example of a receiver for a busty data system

FIG. 3 illustrates a receiver 300 comprising a programmable clock generator that enables a rate of the receiver to be changed from packet to packet. The receiver 300 comprises a Burst Phase Detector 302 configured to receive the data input (Data In) signal and provides a preamble phase and preamble detect signal to a clocking circuit 304, as will be described in more detail below. The data input signal is also provided to a delay component 306, where delayed data input signal is provided to the clocking circuit. The programmable clock generator 308 provides a selected clock signal to the burst phase detector 302 and a delayed clock signal to the clocking circuit 304, as will be described in more detail in reference to FIG. 4.

Figure 4:
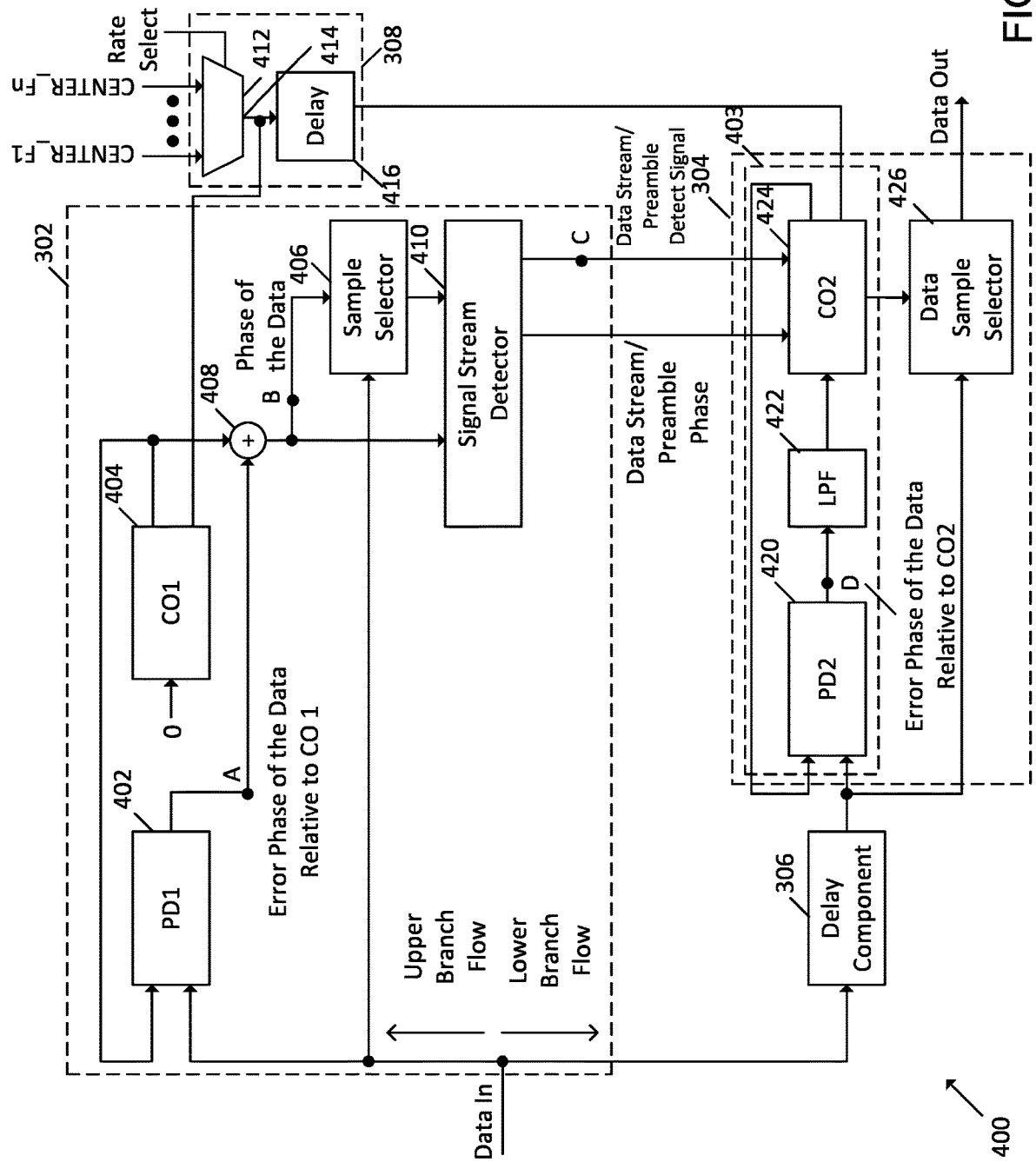
FIG. 4 illustrates another example of a receiver for a bursty data system.

FIG. 4 illustrates a receiver 400 for a bursty data system. The burst detector 302 performs phase detection on an incoming data stream and presets the phase of the PLL 403 to be aligned with the data stream prior to sampling by a sample selector 426. In this way, the receiver 400 of FIG. 4 is able to perform phase detection with a 0 or negative locking time, which will be discussed in further detail below. Optionally, the incoming data stream may include a preamble segment and a data segment The receiver 400 includes an upper branch (first branch) and a lower branch (second branch). The upper branch includes a controlled oscillator (CO) 404, which may be implemented by way of example as a numerically controlled oscillator or a voltage-controlled oscillator, a phase detector PD1 402, a sample selector 406, an adder 408 and a signal stream detector 410. While numerically controlled oscillators may be implemented by way of example in the burst phase detector 302 and clocking circuit 304, it should be understood that voltage-controlled oscillators or an oscillator controlled according to some other value could also be used. The lower branch includes the delay component 306 configured to provide a delayed data input signal to clocking circuit 304.

The phase detector PD1 of the burst phase detector 302 includes a first input coupled to receive the incoming data stream, a second input coupled to an output of a controlled oscillator, shown here by way of example as a controlled oscillator CO1 404 of the burst phase detector 302, and an output coupled to the adder 408. The phase detector PD1 402 of the burst phase detector 302 is configured to generate a phase error at its output and designated as A. The phase error is based on a comparison between the phase of the data input signal and a CO1 phase output by the voltage-controlled oscillator CO1 of the burst phase detector 302. As will be discussed below, the controlled oscillator CO1 of the burst phase detector 302 is fixed and generates a fixed CO1 phase. As such the phase error generated by the phase detector PD1 of the burst phase detector 302 will be fixed. In some cases, where the incoming data stream includes both a preamble segment and a data segment, the phase detector PD1 402 of the burst phase detector 302 may be configured to generate a phase error based on a comparison between the phase of the preamble segment and the CO1 phase generated by the controlled oscillator CO1 of the burst phase detector 302. In other embodiments, the phase detector PD1 402 of the burst phase detector 302 may be configured to generate a phase error based on a comparison between the phase of the data segment and the phase generated by the controlled oscillator CO1 of the burst phase detector 302.

The controlled oscillator CO1 of the burst phase detector 302 is free-running and as such its input is tied to a fixed value, shown here by way of example as "0". The output of the controlled oscillator CO1 of the burst phase detector 302 is coupled to the adder 408. The controlled oscillator CO1 of the burst phase detector 302 is configured to generate a fixed CO1 phase at its output based on the fixed value tied to its input.

The adder includes a first input coupled to the output of the controlled oscillator CO1 of the burst phase detector 302 (e.g., fixed CO1 phase) and a second input coupled to the output of the phase detector PD1 of the burst phase detector 302 (e.g., fixed phase error). The adder 408 combines the CO1 phase and the phase error to generate the runtime phase of the incoming data stream at its output. In some cases, where the incoming data stream includes both a preamble segment and a data segment, the runtime phase generated by the adder may be the runtime phase of the preamble segment. In other embodiments, the runtime phase generated by the adder may be the runtime phase of the data segment.

The sample selector 406 of the burst phase detector 302 includes a first input coupled to an output of the adder 408, a second input coupled to receive the incoming data stream, and an output coupled to the signal stream detector 410. The sample selector 406 is configured to sample the incoming data stream using the runtime phase of the incoming data stream (e.g., combined CO1 phase and phase error) to generate a data stream sample at its output. In some cases, where the incoming data stream includes both a preamble segment and a data segment, the data stream sample may be a sample of the preamble segment. In some other cases, the data stream sample may be a sample of the data segment.

The signal stream detector 410 of the burst phase detector 302 includes a first input coupled to an output of the adder 408 and a second input coupled to the output of the sample selector 406. The signal stream detector 410 is configured to generate a data stream phase at a first output and a data stream detect signal at a second output using the runtime phase of the incoming data stream (e.g. combined CO1 phase and phase error) as well as the data stream sample. The data stream phase is the phase of the incoming data stream. The data stream detect signal is an indication of the start of incoming data from a new transmitter. In some cases, where the incoming data stream includes both a preamble segment and a data segment, the data stream phase may be a preamble segment phase and the data stream detect signal may be a preamble segment detect signal. In other cases, the data stream phase may be a data segment phase. Optionally, the preamble segment may be used to trigger the data stream detect signal.

The controlled oscillator 404 is also configured to receive a clock signal having a user-selectable frequency, where the user selectable frequency enables a rate to be changed from packet to packet and support rates that are not limited to integer multiples of each other. More particularly, the programmable clock generator 308 comprises a selection circuit 412 configured to receive a plurality of clock signals having different frequencies to establish a line rate of receiver, designated by way of example as CENTER_F1 through CENTER_FN. The selection circuit 412 may comprise a multiplexer configured to receive a Rate Select signal to select one of the clock signals provided to the multiplexer. The selected clock signal generated at the output 414 is provided to the controlled oscillator CO1 to define the frequency of the output signal provided to the adder 408. That is, the controlled oscillator generates an output signal having a frequency based upon the selected center frequency of the clock signal output by the selection circuit 412. A delay component 416 may also be used to delay the coupling of the selected clock signal to the controlled oscillator CO2 of the PLL 403. The delay component 416 provides the delayed clock signal to be received by the PLL 403 at the same time that delayed Data In signal is provided to the PLL 403.

The delay component 306 stores the incoming data stream while the upper branch performs phase detection. Once the phase of the incoming data stream has been detected by the upper branch, the delay component releases the incoming data stream to the PLL 403 and the data sample detector 426. The clock signal generated by the clock generator 308 holds the clock signal to correctly time the clock signal provided to controlled oscillator CO2 of the PLL 403. The delay component 306 is configured to store the data input signal for a time period based upon a processing time for generating the data stream phase and a data stream detect signal, and the delay component 416 is configured to provide the selected clock signal to the PLL 403 at the appropriate time to correctly sample the delayed input data.

During operation, incoming data streams enter the receiver 400 and flow into the upper branch as well as the lower branch. In the upper branch, the incoming data stream is detected and the phase of the incoming data stream is determined. The time it takes to detect the incoming data stream and to determine the phase of the incoming data stream is processing time. In the lower branch, the incoming data stream is stored in the delay component 306 until the upper branch detects the incoming data stream and determines its phase. Optionally, the delay component may store the data stream for a time period equal to the processing time. In other embodiments, the delay component stores the data stream for a time period greater than the processing time.

Once the signal stream detector of the burst phase detector 302 has detected the phase of the incoming data stream, the signal stream detector injects that phase into the controlled oscillator CO2 of the PLL 403, such that the CO2 phase generated by the controlled oscillator CO2 of the PLL 403 is aligned with the phase of the incoming data stream.

The PLL 403 includes a phase detector PD2 420, a low-pass filter LPF 422, and a controlled oscillator CO2 424.

The phase detector PD2 420 of the PLL 403 includes a first input coupled to the output of the delay (e.g., delayed incoming data stream) and a second input coupled to an output of the controlled oscillator CO2 of the PLL 403. The phase detector PD2 420 of the PLL 403 is configured to generate a phase error at its output.

The low-pass filter LPF 422 includes an input coupled to the output of the phase detector PD2 420 and an output coupled to an input of the controlled oscillator 424, which may be a voltage-controlled oscillator VCO2 or a numerically-controlled oscillator NCO2. The low-pass filter LPF 422 is configured to remove local noise associated with the output of the phase detector.

The controlled oscillator CO2 of the PLL 403 includes a first input coupled to the low-pass filter LPF, a second input coupled to the data stream phase signal generated by the signal stream detector 410, a third input coupled to receive the data stream detect signal generated by the signal stream detector 410, and an output coupled to the phase detector PD2 of the PLL 403 as well as the data sample selector. The controlled oscillator CO2 424 of the PLL 403 generates a CO2 phase at its output which is coupled to the second input of the phase detector PD2 of the PLL 403 and the data sample selector. The controlled oscillator CO2 of the PLL 403 generates the CO2 phase at its output based on the output of the low-pass filter LPF 422 (e.g., phase error filtered to remove local noise), the data stream phase, and the data stream detect signal, as described in greater detail below.

As mentioned above, once the signal stream detector in the upper branch has detected the phase of the incoming data stream, the signal stream detector injects that phase into the controlled oscillator CO2 of the PLL 403, such that the CO2 phase generated by the controlled oscillator CO2 of the PLL 503 is aligned with the phase of the incoming data stream. Thus, when the phase detector PD2 of the PLL 403 compares the phase of the incoming data stream to the CO2 phase generated by the controlled oscillator CO2 of the PLL 403, a minimal phase error is generated. This minimal phase error is passed to the low-pass filter LPF 422 which removes local noise before being received by the controlled oscillator CO2 of the PLL 403. Because the low-pass filtered phase error is minimal, the controlled oscillator CO2 of the PLL 403 continues to generate a CO2 phase that is aligned with the phase of the incoming data.

The data sample selector 426 receives the incoming data stream from the output of the delay component 306 at the same time that the PLL 403 receives the incoming data stream. The data sample selector is also coupled to the output of the controlled oscillator CO2 of the PLL 403 and uses the CO2 phase generated by the controlled oscillator CO2 to sample the incoming data stream. Because the CO2 phase generated by the controlled oscillator CO2 of the PLL 403 is aligned with the phase of the incoming data stream at the time the data sample selector begins receiving the incoming data stream, the incoming data stream is reliably sampled without any data loss.

Figure 5:
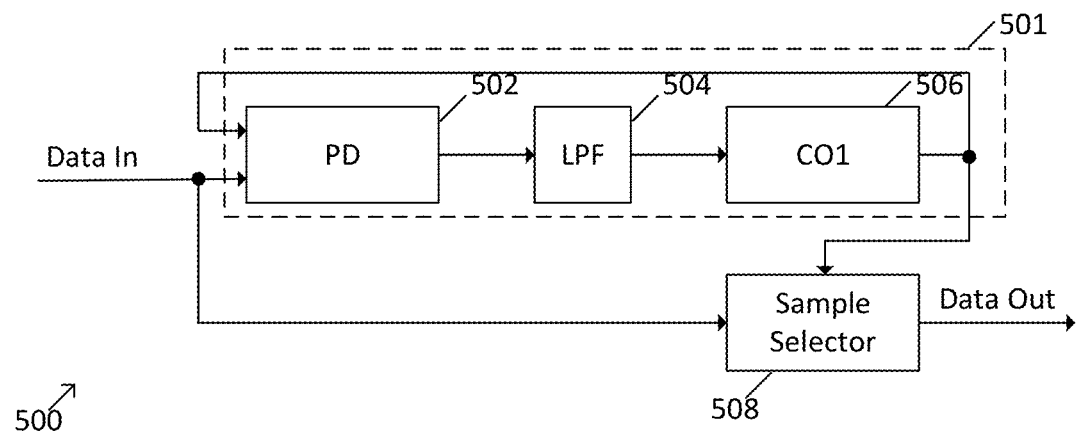
FIG. 5 illustrates a receiver and its application within a bursty data system.

FIG. 5 illustrates a receiver 500 and its application within a bursty data system. The receiver 500 includes a phase-locked loop (PLL) 501 and a sample selector 508. The PLL 501 includes a phase detector PD 502, a low-pass filter LPF 504, and a controlled oscillator CO1 506.

The phase detector PD 502 includes a first input coupled to receive the incoming data stream and a second input coupled to an output of the controlled oscillator CO1. The phase detector PD 502 is configured to generate a phase error at its output.

The low-pass filter LPF 504 includes an input coupled to the output of the phase detector PD and an output coupled to an input of the controlled oscillator CO1 506. The low-pass filter LPF 504 is configured to remove local noise associated with the output of the phase detector PD (e.g. phase error).

The controlled oscillator CO1 includes an input coupled to the low-pass filter LPF and an output coupled to the phase detector PD as well as the sample selector. The controlled oscillator CO1 generates a CO phase at its output.

Initially, an incoming data stream is received at the first input of the phase detector PD 502 of the PLL 501. The controlled oscillator CO1 generates a random CO1 phase which is received at the second input of the phase detector PD of the PLL 501. The phase detector PD compares the phase of the incoming data stream to the CO1 phase generated by the controlled oscillator CO to generate a phase error. The phase error is passed to the low-pass filter LPF which removes local noise before being received by the controlled oscillator CO. The controlled oscillator CO1 generates an adjusted CO1 phase based on the received low-pass filtered phase error. This continues until the CO1 phase generated at the output of the controlled oscillator CO1 is aligned with the phase of the incoming data stream.

Figure 6:
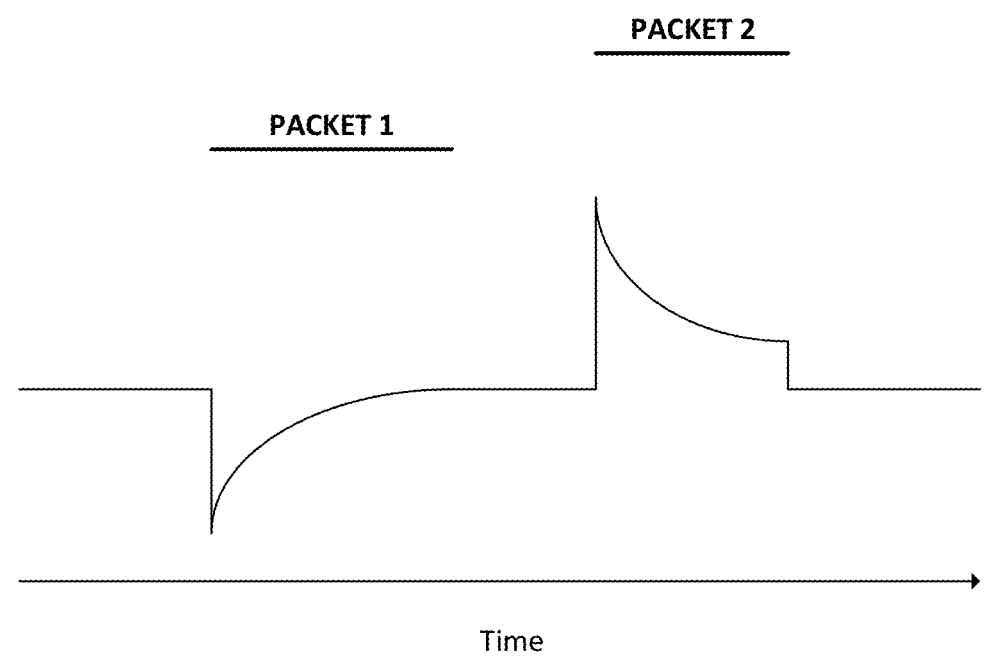
FIG. 6 illustrates the behavior of the PLL of FIG. 5.

FIG. 6 illustrates the behavior of the PLL at measurement point A of FIG. 4. FIG. 6 illustrates the behavior for two different incoming data streams (i.e., packet 1 and packet 2) with different phases. Measurement point A illustrates the phase error at the output of the phase detector PD over time. As can be seen, when the incoming data stream is first received, a large phase error is generated by the phase detector due to the misalignment between the CO1 phase generated at the output of the controlled oscillator CO1 and the phase of the incoming data stream. As the CO1 phase is adjusted, the phase error grows smaller until the CO1 phase is aligned with the phase of the incoming data stream, at which point no error exists at measurement point A.

While the PLL 501 is performing phase detection on the incoming data stream, the incoming data stream is simultaneously being received by the sample selector. The CO1 phase generated by the voltage-controlled oscillator CO1 is transmitted to the sample selector to sample the incoming data stream and generate a data stream sample at its output. Because the CO1 phase is not initially aligned with the phase of the incoming data stream, the sample selector samples the incoming data unreliably and much of the incoming data stream is lost. It is not until the controlled oscillator CO1 generates a CO1 phase that is aligned with the phase of the incoming data stream that the incoming data stream is reliably sampled. In other words, the receiver 500 has a positive locking time (i.e., the time between the start of data stream sampling and the time at which the phase of the data stream is detected is positive) and as such incoming data is lost due to the delay in detecting phase.

Figure 7:
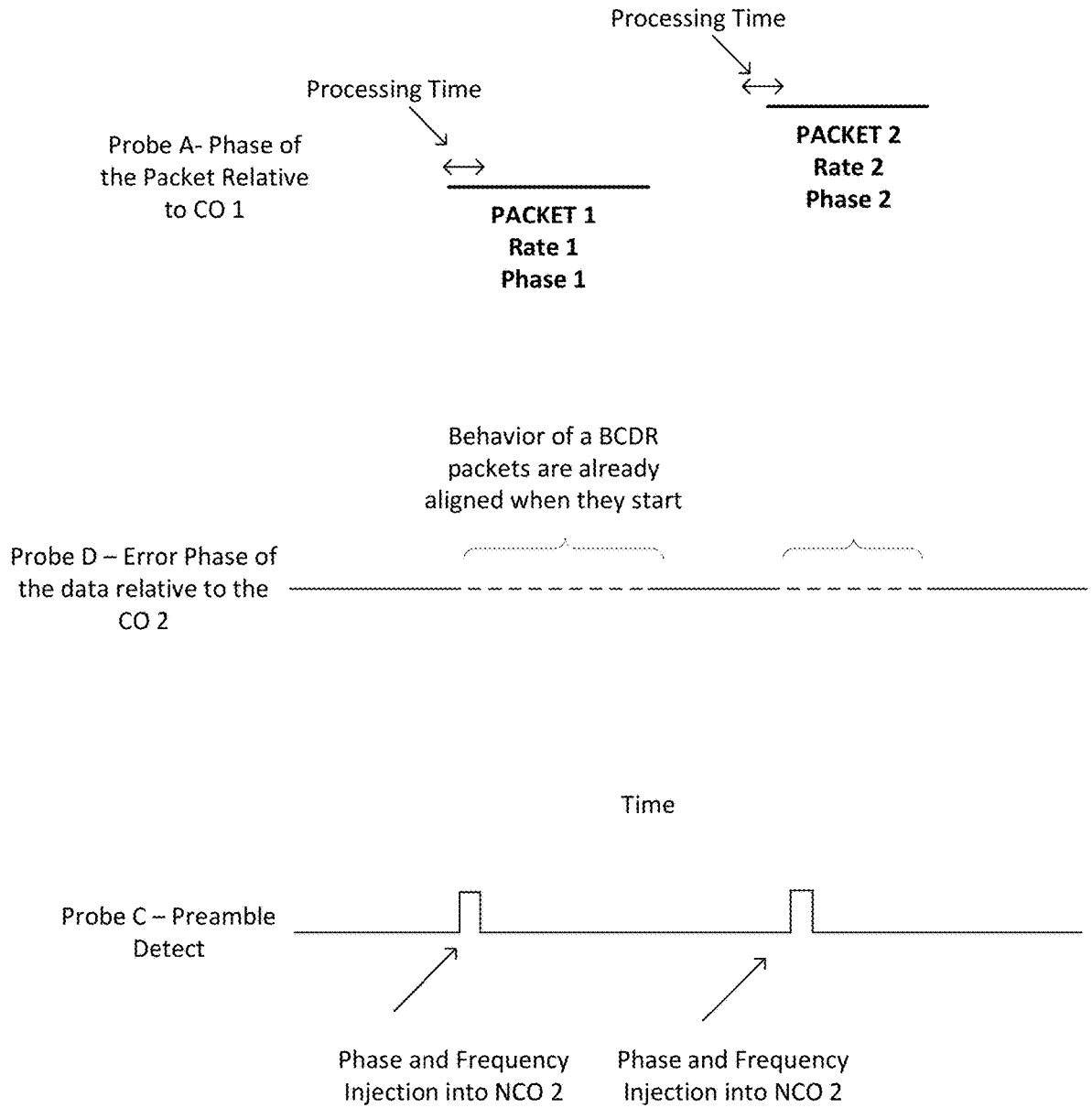
FIG. 7 is a graphical illustration of the behavior of the receiver of FIG. 4.

FIG. 7 is a graphical illustration of the behavior of the receiver 400 of FIG. 4. As soon as the incoming data stream flows into the upper branch, its phase is compared against the CO1 phase generated by the controlled oscillator CO1 of the bursty phase detector 302 to generate a phase error at measurement point A in FIG. 4. This phase error is illustrated in FIG. 4. Because the CO1 phase is fixed, as described above, so too is the phase error. The phase error is combined with the CO1 phase at the adder to generate the runtime phase of the incoming data stream at the output of the adder as shown in of FIG. 4. The processing time, which I am assuming corresponds to the preamble detect (Probe C). Probe D (error phase of the data relative to CO2) shown as straight line (i.e. never changes). The processing time in FIG. 7 matches the delay in FIG. 4 Probe D and appears flat in FIG. 7 because the upper branch has calculated (during the processing time) the correct phase of the incoming data and has injected that into CO2. In this case, CO2 is already tuned to be at the same phase of the next incoming packet and the PD will see no error (i.e. Probe D equal to 0).

As described above, the sample selector of the burst phase detector 302 is configured to sample the incoming data stream using the runtime phase of the incoming data (e.g., combined CO1 phase and phase error) to generate a data stream sample at its output. The signal stream detector of the burst phase detector 302 is configured to generate a data stream phase at a first output and a data stream detect signal at a second output (i.e., measurement point C) using the combined VCO phase and phase error (i.e., runtime phase of the incoming data stream) as well as the data stream sample as described above. The data stream detect signal at measurement point C is illustrated in FIG. 7. In some cases, where the incoming data stream includes a preamble segment and a data segment, the data stream detect signal is a signal that indicates a preamble segment has been detected and not a data segment.

The data stream phase and the data stream detect signal are output to the PLL 403 which aligns the CO2 phase generated by the controlled oscillator CO2 of the PLL 403 with the phase of the incoming data stream. Thus, when the incoming data stream is output from the delay component in the lower branch to the phase detector PD2 of the PLL 403, the phase error generated by the output of the phase detector PD2 of the PLL 403 at measurement point C will be minimal as illustrated in FIG. 7. This is because the point at which the receiver 400 detects the phase of the incoming data stream occurs at the same time or earlier than the start of data sampling by the data sample selector. In other words, the locking time for the receiver 400 is 0 or negative. This is in contrast to the phase error output by the phase detector of the PLL 403 in FIG. 4, where a positive locking time is involved.

Thus, the receiver 400 of FIG. 4 has the ability to perform phase detection with a 0 or negative locking time, thus ensuring that data loss doesn't occur during sampling. Additionally, the receiver 400 of FIG. 4 may be implemented with standard electronics without any speed requirements. Rather than dedicating custom electronics with a high operating speed and high cost for performing phase detection, standard electronics that operate at any speed may be used. This reduces costs and allows for flexible operation of the receiver 400. Moreover, the receiver 400 of FIG. 4 may be configured to perform phase detection on incoming data streams with or without preamble segments. This provides for flexible operation of the receiver and may also reduce bandwidth consumption in situations where the incoming data stream does not include a preamble segment. Preamble segments are not constrained to be a certain length and may be adjusted depending on the particular application.

Figure 8:
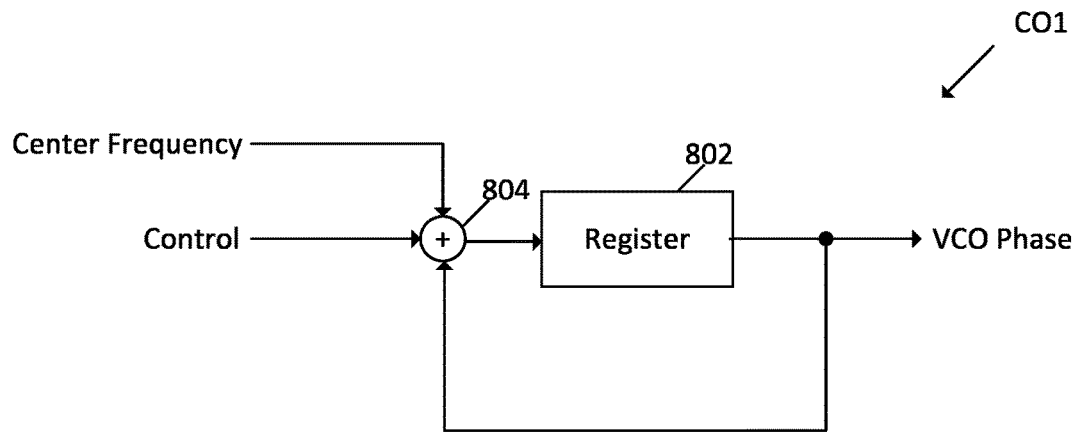
FIG. 8 illustrates a detailed view of the voltage controlled oscillator CO1 of the burst phase detector in FIG. 4

FIG. 8 illustrates a detailed view of the controlled oscillator CO1 of the burst phase detector 302 in FIG. 4. The controlled oscillator CO1 includes a register 802 and an adder 804. An input of the register is coupled to the output of the adder and an output of the register is coupled to a first input of the adder. The adder also includes a second input coupled to receive a control signal and a third input coupled to receive a center frequency signal.

The control signal received by the controlled oscillator CO1 is that shown in FIG. 4. In FIG. 4, the control signal being received by the controlled oscillator CO1 is a fixed value (e.g., 0). The center frequency signal is not shown in FIG. 4 and is a value that is set internally based on the operating frequency of the transmitters that are time-sharing the receiver, such as the programmable clock generator 308. The controlled oscillator CO1 generates a CO1 phase at its output based on the center frequency signal, control signal, and output of the register. The CO1 phase generated by the controlled oscillator CO1 changes as the control signal being received by the adder changes. However, because the controlled oscillator CO1 of the burst phase detector 302 in FIG. 4 is controlled by a fixed value control signal, the CO1 phase generated at the output of the voltage-controlled oscillator CO1 remains fixed, unless the center frequency changes.

Figure 9:
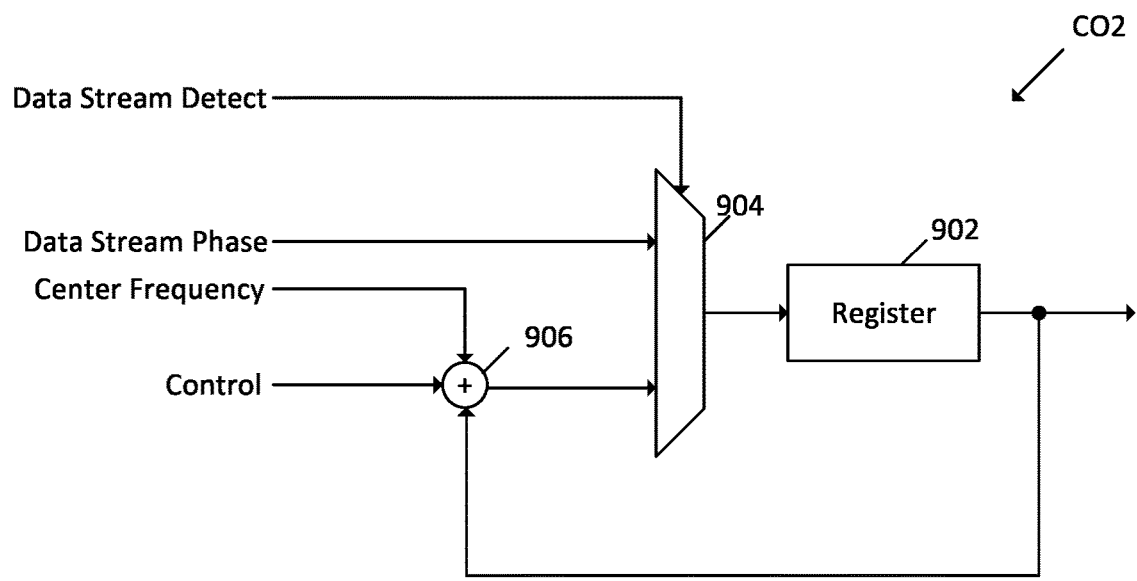
FIG. 9 illustrates a detailed view of the voltage controlled oscillator CO2 of the PLL in FIG. 4.

FIG. 9 illustrates a detailed view of the controlled oscillator CO2 of the PLL 403 in FIG. 4. The controlled oscillator CO2 includes a register 902, a multiplexer 904, and an adder 906. An input of the register is coupled to the output of the multiplexer 904 and an output of the register is coupled to a first input of the adder. A first input of the multiplexer 904 is coupled to receive the data stream phase signal generated by the signal stream detector of the burst phase detector 302, a second input of the multiplexer 904 is coupled to an output of the adder, and a control input of the multiplexer 904 is coupled to receive the data stream detect signal generated by the signal stream detector of the bur-sty burst phase detector 302. The adder also includes a second input coupled to receive a control signal and a third input coupled to receive a center frequency signal.

The control signal received by the controlled oscillator CO2 is that shown in FIG. 4, namely the output of the low-pass filter LPF (e.g., phase error filtered for noise). The center frequency signal is not shown in FIG. 4 and is a value that is set internally based on the operating frequency of the transmitters that are time-sharing the receiver. When the signal stream detector in the burst phase detector 302 generates a data stream detect signal, it causes the multiplexer 904 of the controlled oscillator CO2 of the PLL 403 to select the data stream phase and as such the controlled oscillator CO2 generates a CO2 phase at its output that is aligned with the phase of the incoming data stream. The CO2 phase generated at the output of the controlled oscillator CO2 of the PLL 403 continues to be aligned with the phase of the incoming data stream until a different data stream detect signal is received by the controlled oscillator CO2 of the PLL 403.

As already mentioned above, the receiver 400 of FIG. 4 has several advantages over other techniques for handling bursty data systems. The receiver 400 of FIG. 4 has the ability to perform phase detection with a 0 or negative locking time, thus ensuring that data loss doesn't occur during sampling. Additionally, the receiver 400 of FIG. 4 may be implemented with standard electronics without any speed requirements. Rather than dedicating custom electronics with a high operating speed and high cost for performing phase detection, standard electronics that operate at any speed may be used. This reduces costs and allows for flexible operation of the receiver. Moreover, the receiver 400 of FIG. 4 may be configured to perform phase detection on incoming data streams with or without preamble segments. This provides for flexible operation of the receiver and may also reduce bandwidth consumption in situations where the incoming data stream does not include a preamble segment. Preamble segments are not constrained to be a certain length and may be adjusted depending on the particular application.

The receiver 400 for a bursty data system also supports fractional relationships. The burst phase detector 302 performs phase detection on an incoming data stream as discussed above in regard to burst phase detector 302. In order to support fractional relationships between a reference clock frequency and an output frequency, the clocking circuit 304 has a different configuration and function as those described with reference to the clocking circuit 304.

In particular, the controlled oscillator (CO2) of the clocking circuit 304 is disconnected from the low pass filter (LPF) and the phased detector (PD2). This allows controlled oscillator CO2 to operate independently from the low pass filter LPF and/or the phase detector PD2 of the clocking circuit 304, which enables controlled oscillator CO2 to operate at frequencies unsupported by the clocking circuit 304 illustrated in FIG. 4. Because the controlled oscillator CO2 does not receive input from the low pass filter LPF, and does not provide output for the phase detector PD2, the configuration and operation of the controlled oscillator CO2 in the clocking circuit 304 are different from those of the controlled oscillator CO2 in the clocking circuit 304. An example of the controlled oscillator CO2 for the clocking circuit 304 will be described with reference to FIG. 10 below.

In some embodiments, the clocking circuit 304 may have additional or fewer circuits. For instance, the clocking circuit 304 may include only the controlled oscillator CO2 to achieve less overall real-estate of a semiconductor substrate. In such cases, the phase detector PD2 and the low pass filter LPF may be considered separate from the clocking circuit 304. In other embodiments, the clocking circuit 304 may optionally include circuit(s) that allows a feedback path of the clocking circuit 304 to be enabled and disable depending on the circumstances. For instance, the clocking circuit 304 may include switching circuit(s) for managing the interconnection of the components in the clocking circuit 304. Furthermore, in other cases, the clocking circuit 304 may include switching circuits that enable or disable the voltage sources connected to the phase detector PD2 and the low pass filter LPF, thereby lowering power consumption as well as disabling the components.

In some cases, the controlled oscillator CO2 may support non-fractional mode (that utilizes the phase detector PD2 and low pass filter LPF as illustrated in FIG. 4) as well as fractional mode. In such multimode scenario, the control signal may either be zero when in a mode that supports fractional relationships between the reference frequency of a controllable oscillator and the output frequency, or be the output of the low pass filter LPF when in a mode that supports integer relationships between the reference frequency and the output frequency. In such cases, the controlled oscillator CO2 of the clocking circuit 304 may be configured to selectively couple to the low pass filter LPF. This may be accomplished through switching between various permutations of disconnecting the low pass filter LPF, pulling down the control input, or disabling the low pass filter LPF. In one technique, in order to conserve energy and to avoid generating unnecessary noise and heat within the circuit, the unused components (e.g., the phase detector PD2 and low pass filter LPF) may be disabled when in the mode that supports fractional relationships, by for instance power gating or disconnecting their inputs and/or outputs. In other cases, the controlled oscillator CO2 may support only fractional relationships between the reference frequency and the output frequency. In such cases, the controlled oscillator CO2 may be completely disconnected from the low pass filter LPF, and operation of the controlled oscillator CO2 will not rely on output from the low pass filter LPF.

Figure 10:
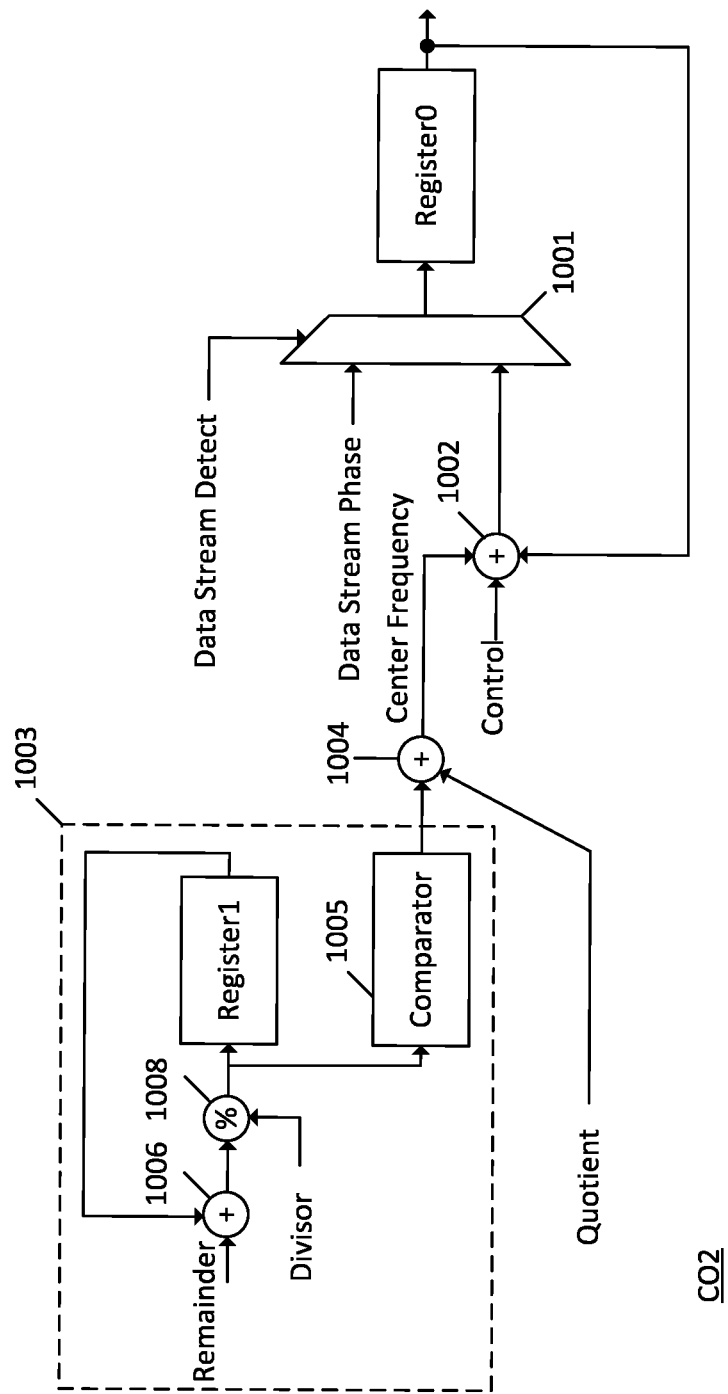
FIG. 10 illustrates a detailed view of controlled oscillator CO2 of the PLL in FIG. 4 that supports fractional relationships.

FIG. 10 illustrates the voltage controlled oscillator CO2 of the clocking circuit 304 of FIG. 4 that supports fractional relationships. The controlled oscillator CO2 includes a register (register0), a multiplexer 1001, and a first adder 1002. An input of the register is coupled to receive an output from the multiplexer 1001, and an output of the register is configured to provide an input to a first input of the first adder 1002. A first input of the multiplexer 1001 is configured to receive the data stream phase signal generated by the signal stream detector of the burst phase detector 302, a second input of the multiplexer 1001 is configured to receive an output of the first adder 1002, and a control input of the multiplexer 1001 is coupled to receive the data stream detect signal generated by the signal stream detector of the burst phase detector 302. The first adder 1002 also includes a second input configured to receive a control signal, and a third input configured to receive a center frequency signal.

The control signal is for selectively connecting the controlled oscillator CO2 to the low pass filter LPF, and disconnecting the controlled oscillator CO2 from the low pass filter LPF during different modes of operation. As discussed, during a mode that supports fractional relationship(s) between the reference frequency of a controllable oscillator and the output frequency, the controlled oscillator CO2 is to be disconnected from the low pass filter LPF. This will cause the controlled oscillator CO2 to be disconnected from the feedback loop in the clocking circuit 304. If the controlled oscillator CO2 is not disconnected from the feedback loop, the clocking circuit 304 will attempt to adjust the fractional component or remainder from the output of the controlled oscillator CO2, rendering the clocking circuit 903 incapable of supporting the fractional relationship(s). During a mode that supports integer relationship(s), the controlled oscillator CO2 is to be connected to the low pass filter LPF. In some cases, the control signal may be provided from a separate module (e.g., circuit).

The voltage-controlled oscillator CO2 of FIG. 10 is similar to that described with reference to FIG. 7, except that additional circuitry is provided including sigma-delta circuit 1003, and a second adder 1004. The additional circuitry enables the controlled oscillator CO2 of FIG. 10 to support fractional relationships between the output frequency and the reference frequency.

The sigma-delta circuit 1003 comprises an adder 1006 (e.g., a third adder), a modulus circuit 1008, a register (register1), and comparator 1005. The adder 1006 has a first input configured to receive a remainder, and a second input configured to receive the output of register1. The modulus circuit 1008 has a first input configured to receive an output from the adder 1006, and a second input configured to receive a divisor. The input of the Register1 and the input of the comparator 1005 are configured to receive the output of the modulus circuit 1008. The comparator 1005 may be configured to receive the remainder, and may have a memory (e.g., storage component) for storing the remainder. In other cases, the comparator 1005 may have an input coupled to receive the remainder. In some embodiments, register0 is a n-bit register and register1 is a m-bit register.

In the embodiments discussed with reference to FIG. 4, the center frequency is an integer value, and that integer value remains the same for the duration of the individual data stream. On the other hand, the sigma-delta circuit 1003 of FIG. 10 can modulate the center frequency by one or zero. In essence the sigma-delta circuit 1003 provides the fractional component of the frequency relationship. Here, center frequency=Fout/Frefclk, which according to the Euclidean division algorithm, may be represented by: center frequency=Fout/Frefclk=Quotient+Remainder/Divisor.
Where the quotient is equal to the integer portion of the equation.

In operation, the sigma-delta circuit 1003 outputs a zero or a one. The sigma-delta circuit 1003 outputs a "1" (one) whenever the output of the modulus circuit 1008 is less than the remainder as determined by the comparator 1005, and outputs a "0" (zero) whenever the output of the modulus circuit 1008 is not less than the remainder as determined by the comparator 1005. For instance, if the divisor equals 31, and the remainder equals 7, the sigma-delta circuit 1003 will output a 1 once every 4 or 5 cycles.

In the first cycle, register1 is set to zero, and the third adder 1006 receives (1) a remainder of 7, and (2) the output of the register1, which is zero in the example. The third adder 1006 performs the addition of 7+0=7, and outputs this result of "7" to the modulus circuit 1008. The modulus of 7 with 31 is 7. This output ("7") from the modulus circuit 1008 is transmitted to the register1 for storage, and is also transmitted to the comparator 1005. The comparator 1005 compares this 7 with the remainder of 7, and determines that the output of the modulus circuit 1008 ("7" in the example) is not less than the remainder of 7. Therefore, a 0 is output by the comparator 1005 of the sigma-delta circuit 1003.

In the next cycle, the remainder remains at 7, but the output of register1 is now 7. The third adder 1006 performs the addition 7+7=14, and outputs this result to the modulus circuit 1008. The modulus of 14 with the divisor of 31 is 14. This output ("14") from the modulus circuit 1008 is transmitted to the register1 for storage, and is also transmitted to the comparator 1005. The comparator 1005 compares 14 with the remainder of 7, and determines that 14 is not less than the remainder of 7. Therefore, the comparator 1005 of the sigma-delta circuit 1003 outputs a 0.

In the next cycle, the remainder remains at 7, but the output of register1 is now 14. The third adder 1006 performs the addition 7+14=21, and outputs this result to the modulus circuit 1008. The modulus of 21 with the divisor of 31 is 21. This output ("21") from the modulus circuit 1008 is transmitted to the register1 for storage, and is also transmitted to the comparator 1005. The comparator 1005 compares 21 with the remainder of 7, and determines that 21 is not less than the remainder of 7. Therefore, the comparator 1005 of the sigma-delta circuit 1003 outputs a 0.

In the next cycle, the remainder remains at 7, but the output of register1 is now 21. The third adder 1006 performs the addition 7+21=28, and outputs this result to the modulus circuit 1008. The modulus of 28 with the divisor of 31 is 28. This output ("28") from the modulus circuit 1008 is transmitted to the register1 for storage, and is also transmitted to the comparator 1005. The comparator 1005 compares 28 with the remainder of 7, and determines that 28 is not less than the remainder of 7. Therefore, the comparator 1005 of the sigma-delta circuit 1003 outputs a 0.

In the next cycle, the remainder remains at 7, but the output of register1 is now 28. The third adder 1006 performs the addition 7+28=35, and outputs this result to the modulus circuit 1008. The modulus of 35 with the divisor of 31 is 4. This output ("4") from the modulus circuit 1008 is transmitted to the register1 for storage, and is also transmitted to the comparator 1005. The comparator 1005 compares 4 with the remainder of 7, and determines that 4 is less than the remainder of 7. Therefore, the comparator 1005 of the sigma-delta circuit 1003 outputs a 1.

In the next cycle, the remainder remains at 7, but the output of the register1 is now 4. The third adder 1006 performs the addition 7+4=11. The third adder 1006 outputs this result to the modulus circuit 1008. The modulus of 11 with 31 is 11. This output ("11") from the modulus circuit 1008 is transmitted to the register1 for storage, and is also transmitted to the comparator 1005. The comparator 1005 compares 11 with the remainder of 7, and determines that 11 is not less than the remainder of 7. Therefore a 0 is again is output by the comparator 1005 of the sigma-delta circuit 1003. It should be noted that throughout the above processing cycles, the data stream remains the same.

As shown in the above example, the sigma-delta circuit 1003 provides a regular adjustment to the center frequency when combined with the quotient at the second adder 1004. Specifically, the output of the sigma-delta circuit 1003 is added to the quotient at adder 1004. This value then becomes the value of the center frequency input into 1002. In effect, the output of the sigma-delta circuit 1003 provides a periodic or near periodic increase to the sampling frequency used to capture data. In this way, the center frequency is adjusted to provide ongoing corrections for the drift in a sampling frequency, and thereby supporting fractional relationships between the reference frequency and the output frequency. Following the above example, and using "100" as an example of the quotient, the adding of the comparator's output to the quotient will result in the following center frequency outputs (out frequency):

| Quotient | Remainder | Register1 | Comparator input | Comparator output | Center Frequency |
|---|---|---|---|---|---|
| 100 | 7 | 0 | 7 | 0 | 100 |
| 100 | 7 | 7 | 14 | 0 | 100 |
| 100 | 7 | 14 | 21 | 0 | 100 |
| 100 | 7 | 21 | 28 | 0 | 100 |
| 100 | 7 | 28 | 35 | 1 | 101 |
| 100 | 7 | 4 | 11 | 0 | 100 |
| 100 | 7 | 11 | 18 | 0 | 100 |
| 100 | 7 | 18 | 25 | 0 | 100 |
| 100 | 7 | 25 | 32 | 1 | 101 |
| 100 | 7 | 1 | 8 | 0 | 100 |
| 100 | 7 | 8 | 15 | 0 | 100 |
| 100 | 7 | 15 | 22 | 0 | 100 |
| 100 | 7 | 22 | 29 | 0 | 100 |
| 100 | 7 | 29 | 36 | 1 | 101 |
| 100 | 7 | 5 | 13 | 0 | 100 |
| 100 | 7 | 13 | 20 | 0 | 100 |
| 100 | 7 | 20 | 27 | 0 | 100 |
| 100 | 7 | 27 | 34 | 1 | 101 |
| 100 | 7 | 3 | 10 | 0 | 100 |
| 100 | 7 | 10 | 17 | 0 | 100 |
| 100 | 7 | 17 | 24 | 0 | 100 |
| 100 | 7 | 24 | 31 | 1 | 101 |

Similar to the operation of the circuit illustrated in FIG. 4, the center frequency for FIGS. 4 and 10 are set based on the operating frequency of the transmitters that are time-sharing the receiver. When the signal stream detector in the burst phase detector 302 generates a data stream detect signal, it causes the multiplexer 1001 of the controlled oscillator CO2 in the clocking circuit 903 to select the data stream phase. As such, the controlled oscillator CO2 generates a CO2 phase at its output that is aligned with the phase of the incoming data stream. However, the CO2 phase generated at the output of the controlled oscillator CO2 of the clocking circuit 304 may drift with respect to the phase of the incoming data stream. Therefore, the sigma-delta circuit 1003 provides regular correction with respect to the phase of the incoming data stream, so that the drift may be reduced or eliminated.

As shown in the above embodiments, the clocking circuit 304 is configured to operate based on a fractional relationship between a reference clock frequency and an output frequency (e.g., center frequency). In some cases, the output frequency is the same as the data stream frequency. Also, the reference clock frequency and the sample frequency may have an integer relationship (e.g., may have a ratio of 1). Thus, by configuring the clocking circuit 304 to support a fractional relationship between the reference clock frequency and the output frequency, the clocking circuit 304 also supports a fractional relationship between the sample frequency and the frequency of the data stream.

Figure 11:
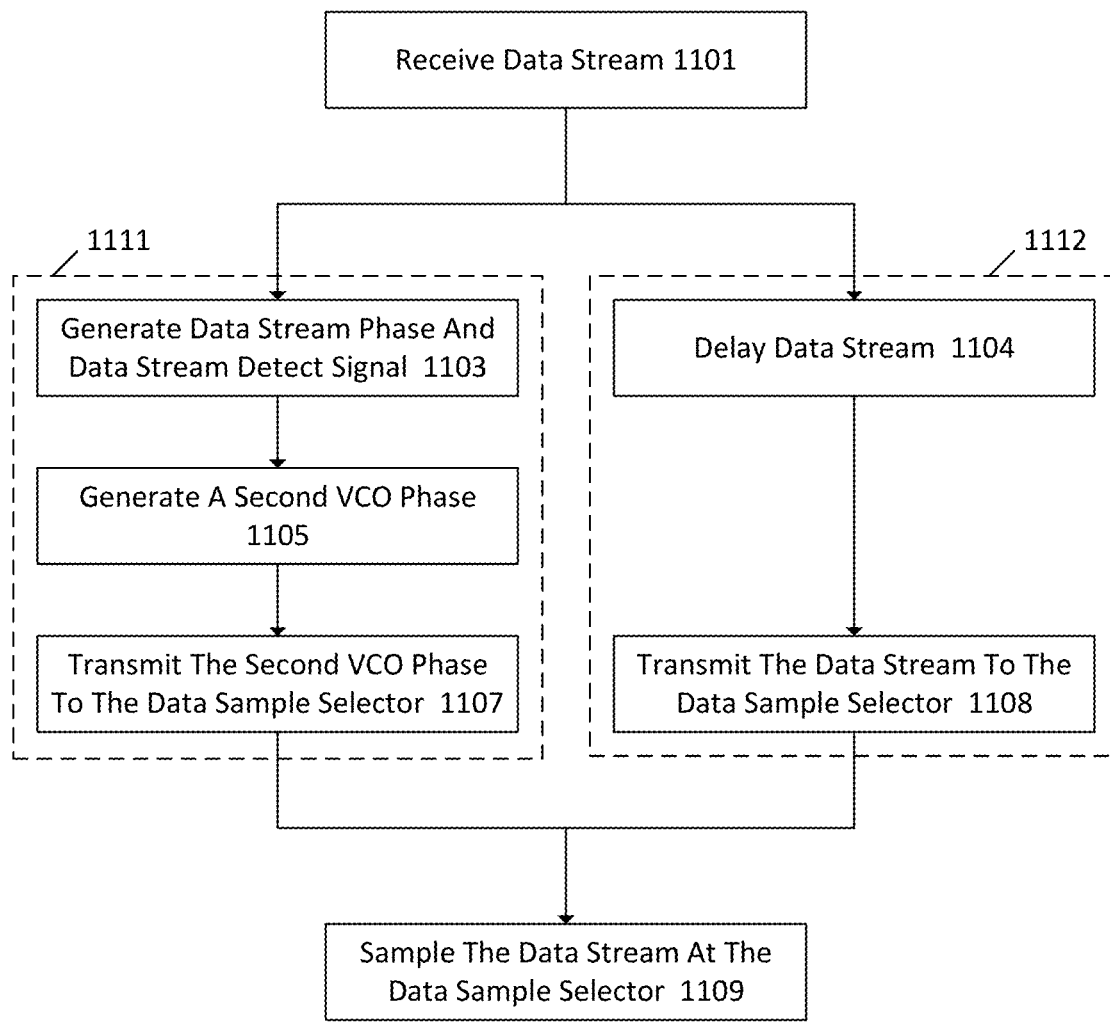
FIG. 11 illustrates a flowchart of an approach to implementing data stream sampling using a bursty data system.

FIG. 11 illustrates a method for data stream sampling using a bursty data system. The method includes, receiving a data stream as an input (item 1101). The method then proceeds to a first sub-method 1111 and a second sub-method 1112. The items in the first sub-method 1111 correspond to the upper branch of a bursty data system as described with reference to FIGS. 4 and 10. The items in the second sub-method 1112 correspond to the lower branch of a bursty data system as described with reference to FIGS. 4 and 10. The first sub-method 1111 includes generating a data steam phase and a data stream detect signal (item 1103) which uses at least a first VCO phase, generating a second VCO phase (item 1105), transmitting the second VCO phase to the data sample selector (item 1107). The second sub-method 1112 includes at least delaying that data stream where it feeds into the data sample selector (item 1104) before it is transmitted to the data sample selector (item 1108). Finally, the data stream is and sampled at the data sample selector using the second VCO phase (item 1109).

At item 1101, a data stream is received at a bursty data system such as the one illustrated in FIGS. 4 and 10. Additionally, the data stream is routed to a first sub-method 1111 and a second sub-method 1112. While various types of data streams may be received, the present discussion will be limited to receiving bursty data streams. In some embodiments the data stream may be a bursty data stream that requires a fractional relationship between an output frequency and a reference frequency for accurate and reliable sampling.

In the first sub-method 1111, at item 1103, a data stream phase and a data stream detect signal are generated, which by way of example may be performed by utilizing the phase detector PD1, the first voltage-controlled oscillator CO1, the adder which is configured to receive the outputs of phase detector PD1 and the first voltage-controlled oscillator CO1, the sample selector, and the detector as illustrated in FIG. 8.

Then at item 1105 a second CO phase is generated using the voltage controlled oscillator CO2, wherein the second CO phase is generated using a clocking circuit which supports fractional relationships between the reference clock and the output frequency as illustrated and discussed with reference to FIGS. 4 and 10. The details of item 1105 are described with reference to FIGS. 4 and 10, and therefore will not be repeated herein.

At item 1107, the second CO phase is transmitted to the data sample selector (such as that described with reference to FIG. 4).

At the same time that the first sub-method 1111 is being performed to generate the second VCO phase, the second sub-method 1112 is being performed to delay the data stream between the input and the data sample selector.

At item 1104, a delay component, such as the delay component described with reference to FIG. 4, is used to delay the data stream. In some embodiments, the delay component delays the data stream for the amount of time required for the first sub-method 1111 to perform at least items 1103 and 1105. In other embodiments the amount of time may be greater than or equal to the amount of time required for the first sub-method 1111, or equal to the amount of time required for the first sub-method 1111 plus some prescribed amount (e.g., minimum threshold) of time.

At item 1108, the data stream is transmitted to the data sample selector described with reference to FIG. 4.

At item 1109, the data sample selector receives the second CO phase and the data stream, accurately and reliably samples the data stream.

Figure 12:
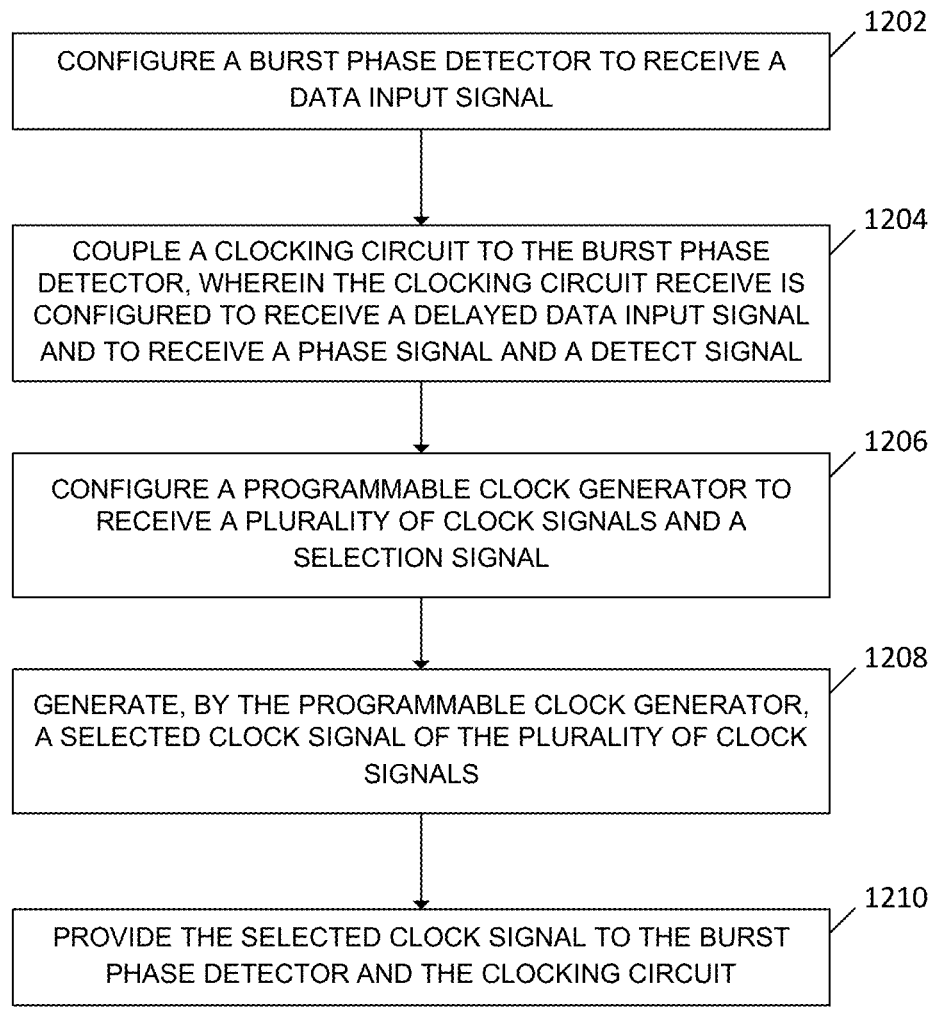
FIG. 12 illustrates a flowchart showing a method of processing a data stream.

FIG. 12 illustrates a flowchart showing a method of processing a data stream. A method of processing a data stream is described in FIG. 12. The method could be implemented according to implementations of FIGS. 3 and 4 for example or other suitable circuits for processing a data stream. According to one implementation, a burst phase detector, such as the burst phase detector 302, is configured to receive a data input signal at a block 1202. A clocking circuit, such as the clocking circuit 304, is coupled to the burst phase detector, wherein the clocking circuit receive is configured to receive a delayed data input signal and to receive a phase signal and a detect signal at a block 1204. A programmable clock generator, such as programmable clock generator 308 is configured to receive a plurality of clock signals and a selection signal at a block 1206. A selected clock signal of the plurality of clock signals is generated, by the programmable clock generator, at a block 1208. The selected clock signal is provided to the burst phase detector and the clocking circuit at a block 1210.

According to some implementations, configuring the burst phase detector may comprise configuring a controlled oscillator to provide a phase signal at an output; and coupling a phase detector with a first input to receive the data input signal and a second input coupled to the output of the controlled oscillator, the phase detector configured to provide a phase error at its output.

Configuring the burst phase detector may further comprise coupling a sample selector with a first input to receive a sum of the phase signal and the phase error, and a second input coupled to receive the data stream, the sample selector configured to provide a data stream sample at its output; and coupling a data stream detector with a first input to receive the sum of the VCO phase and the phase error, and a second input coupled to the output of the sample selector, the data stream detector configured to generate a data stream phase and a data stream detect signal.

The method may further comprise coupling a delay component to the programmable clock generator and adapted to receive the data input signal and generate the delayed data input signal, and coupling a second delay component to the programmable clock generator, wherein the second delay element is adapted to receive the data input signal and generate the delayed data input signal.

According to some implementations, the delay component may be configured to store the data stream for a time period greater than, or equal to, a processing time for generating the data stream phase and the data stream detect signal. The clocking circuit may comprise a phase detector coupled to receive the delayed data input signal. The clocking circuit may comprise a controlled oscillator coupled to receive an output of the phase detector. The programmable clock generator may comprise a selection circuit coupled to receive the plurality of clock signals, and the selection circuit is configured to select a clock signal of the plurality of clock signals in response to the selection signal. The programmable clock generator may comprise a delay element coupled to an output of the selection circuit.

As used in this specification, the term "output" may refer to an output signal, or a physical output (e.g., port, node, connection, etc.) of a component. Similarly, the term "input" may refer to an input signal, or a physical input (e.g., port, node, connection, etc.) of a component. Also, "first output" and "second output" may refer to separate physical outputs, or to a single physical output that is configured for, or is capable of, outputting first and second output signals. Similarly, "first input" and "second input" may refer to separate physical inputs, or to a single physical input that is configured for, or is capable of, receiving first and second input signals.

Although particular embodiments have been shown and described, it will be understood that they are not intended to limit the claimed invention, and it will be clear to those skilled in the art that various changes and modifications may be made without departing from the claimed invention. The specification and drawings are, accordingly, to be regarded in an illustrative rather than restrictive sense. The claimed invention is intended to cover modifications and alternatives.

What is claimed is:

1. A circuit for processing a data stream, comprising:
a burst phase detector configured to receive a data input signal;
a clocking circuit coupled to the burst phase detector, wherein the clocking circuit is configured to receive a delayed data input signal and to receive a data stream phase signal and a data stream detect signal; and
a programmable clock generator configured to receive a plurality of clock signals;
wherein a selected clock signal of the plurality of clock signals is generated by the programmable clock generator and provided to the burst phase detector and the clocking circuit.

2. The circuit of claim 1, wherein the burst phase detector comprises:
a controlled oscillator configured to provide a phase signal at an output;
a phase detector with a first input coupled to receive the data input signal and a second input coupled to the output of the controlled oscillator, the phase detector configured to provide a phase error at its output.

3. The circuit of claim 2, wherein the burst phase detector comprises:
a sample selector with a first input coupled to receive a sum of the phase signal and the phase error, and a second input coupled to receive the data input signal, the sample selector configured to provide a data stream sample at its output; and
a signal stream detector with a first input coupled to receive the sum of the phase signal and the phase error, and a second input coupled to the output of the sample selector, the signal stream detector configured to generate the data stream phase signal and the data stream detect signal.

4. The circuit of claim 1, further comprising a delay component coupled to the programmable clock generator and adapted to receive the data input signal and generate the delayed data input signal.

5. The circuit of claim 4, wherein the delay component is configured to store the data input signal for a time period based upon a processing time for generating the data stream phase signal and the data stream detect signal.

6. The circuit of claim 5, wherein the clocking circuit comprises a phase detector coupled to receive the delayed data input signal and a controlled oscillator coupled to receive an output of the phase detector.

7. The circuit of claim 6, wherein the clocking circuit is configured to operate based on a fractional relationship between a reference frequency and an output frequency.

8. The circuit of claim 7, wherein the clocking circuit comprises a sigma-delta circuit, wherein an output of the sigma-delta circuit represents a fractional portion of an output of the controlled oscillator.

9. The circuit of claim 1, wherein the programmable clock generator comprises a selection circuit coupled to receive the plurality of clock signals, and the selection circuit is configured to select a clock signal of the plurality of clock signals in response to a selection signal.

10. The circuit of claim 9, wherein the programmable clock generator comprises a delay element coupled to an output of the selection circuit.

11. A method of processing a data stream, the method comprising:
configuring a burst phase detector to receive a data input signal;
coupling a clocking circuit to the burst phase detector, wherein the clocking circuit is configured to receive a delayed data input signal and to receive a data stream phase signal and a data stream detect signal; and
configuring a programmable clock generator to receive a plurality of clock signals;
wherein a selected clock signal of the plurality of clock signals is generated by the programmable clock generator and provided to the burst phase detector and the clocking circuit.

12. The method of claim 11, wherein configuring the burst phase detector comprises:
configuring a controlled oscillator to provide a phase signal at an output; and
coupling a phase detector with a first input to receive the data input signal and a second input to the output of the controlled oscillator, wherein the phase detector is configured to provide a phase error at its output.

13. The method of claim 12, wherein configuring the burst phase detector comprises:
coupling a sample selector with a first input to receive a sum of the phase signal and the phase error, and a second input coupled to receive the data input signal, wherein the sample selector is configured to provide a data stream sample at its output; and
coupling a signal stream detector with a first input to receive the sum of the phase signal and the phase error, and a second input to receive the output of the sample selector, wherein the signal stream detector is configured to generate the data stream phase signal and the data stream detect signal.

14. The method of claim 11, further comprising coupling a delay component to the programmable clock generator, wherein the delay component is adapted to receive the data input signal and generate the delayed data input signal.

15. The method of claim 14, wherein the delay component is configured to store the data input signal for a time period based upon a processing time for generating the data stream phase signal and the data stream detect signal.

16. The method of claim 15, wherein the clocking circuit comprises a phase detector coupled to receive the delayed data input signal and a controlled oscillator coupled to receive an output of the phase detector.

17. The method of claim 16, wherein the clocking circuit is configured to operate based on a fractional relationship between a reference frequency and an output frequency.

18. The method of claim 17, wherein the clocking circuit comprises a sigma-delta circuit, wherein an output of the sigma-delta circuit represents a fractional portion of an output of the controlled oscillator.

19. The method of claim 11, wherein the programmable clock generator comprises a selection circuit coupled to receive the plurality of clock signals, and the selection circuit is configured to select a clock signal of the plurality of clock signals in response to a selection signal.

20. The method of claim 19, wherein the programmable clock generator comprises a delay element coupled to an output of the selection circuit.

* * * * *